United States Patent
Adams et al.

(10) Patent No.: US 11,326,982 B2
(45) Date of Patent: May 10, 2022

(54) REFERENCING INSERTION LOSS USING BACK-FACET MONITOR FROM LASERS

(71) Applicant: VIAVI SOLUTIONS INC., San Jose, CA (US)

(72) Inventors: Robert Matthew Adams, Ottawa (CA); Joshua Philipson, Ottawa (CA); Darren Bruce, Ottawa (CA)

(73) Assignee: VIAVI SOLUTIONS INC., San Jose, CA (US)

( * ) Notice: Subject to any disclaimer, the term of this patent is extended or adjusted under 35 U.S.C. 154(b) by 0 days.

(21) Appl. No.: 16/297,328

(22) Filed: Mar. 8, 2019

(65) Prior Publication Data

US 2019/0280457 A1 Sep. 12, 2019

Related U.S. Application Data

(60) Provisional application No. 62/641,163, filed on Mar. 9, 2018.

(51) Int. Cl.
| | |
|---|---|
| *G01M 11/00* | (2006.01) |
| *H01S 5/00* | (2006.01) |
| *H01S 5/0683* | (2006.01) |
| *G01R 31/26* | (2020.01) |

(52) U.S. Cl.
CPC ........... *G01M 11/33* (2013.01); *G01M 11/30* (2013.01); *G01M 11/337* (2013.01); *G01R 31/2635* (2013.01); *H01S 5/0014* (2013.01); *H01S 5/0683* (2013.01)

(58) Field of Classification Search
CPC ..... G01M 11/30; G01M 11/33; G01M 11/337
See application file for complete search history.

(56) References Cited

U.S. PATENT DOCUMENTS

| | | | | |
|---|---|---|---|---|
| 4,336,047 A | * | 6/1982 | Pavlopoulos | G02B 6/2835 65/32.4 |
| 9,143,236 B1 | * | 9/2015 | Bartur | H04B 10/071 |
| 2003/0063889 A1 | * | 4/2003 | Lavallee | G02B 6/32 385/24 |
| 2005/0084219 A1 | * | 4/2005 | Catchmark | G02B 6/423 385/92 |
| 2007/0183465 A1 | * | 8/2007 | Mullane | H01S 5/0625 372/24 |
| 2016/0164601 A1 | * | 6/2016 | Perron | G01M 11/33 398/38 |
| 2016/0273034 A1 | * | 9/2016 | Lundquist | C12Q 1/6874 |

OTHER PUBLICATIONS

Telecommunications Industry Association, "Optical Power Loss Measurements of Installed Multimode Fiber Cable Plant; IEC 61280-4-1 edition 2, Fibre-Optic Communications Subsystem Test Procedure—Part 4-1: Installed cable plant—Multimode attenuation measurement" ANSI/TIA-526-14-B-2010 Standard (Year: 2010).*

* cited by examiner

*Primary Examiner* — Violeta A Prieto
(74) *Attorney, Agent, or Firm* — Mannava & Kang, P.C.

(57) ABSTRACT

A test instrument is operable to test optical components of a fiber optic network. The test instrument includes a laser having a back-facet monitor. The test instrument measures a performance parameter of an optical component being tested based on optical power of the laser measured by the back-facet monitor. The performance parameter is determined based on optical power measurements that account for drift of the laser.

17 Claims, 5 Drawing Sheets

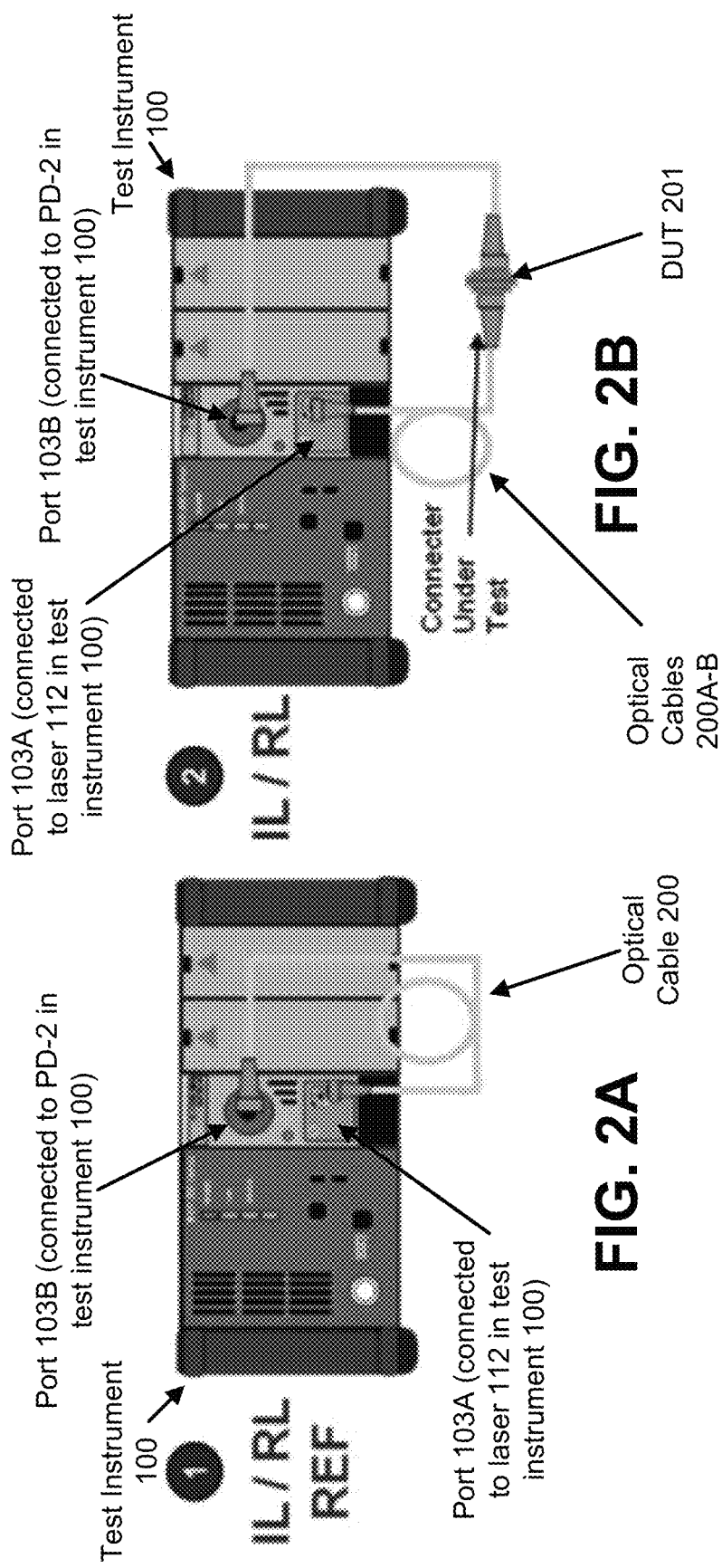

500

```
┌─────────────────────────────┐
│ measure optical power at BFM of │
│ laser emitting light from at least │
│    one port of the test instrument │
│              501            │
└─────────────────────────────┘
              │
              ▼
┌─────────────────────────────┐
│  measure optical power of input │
│ light received via at least one port │
│       of the test instrument │
│              502            │
└─────────────────────────────┘
              │
              ▼
┌─────────────────────────────┐
│ calculates $P_{reference}$ and $P_{DUT}$ based │
│         on the measurements │
│              503            │
└─────────────────────────────┘
              │
              ▼
┌─────────────────────────────┐
│     determine a performance │
│  parameter of the DUT 201 based │
│    on $P_{reference}$ and $P_{DUT}$ │
│              504            │
└─────────────────────────────┘
```

FIG. 5

REFERENCING INSERTION LOSS USING BACK-FACET MONITOR FROM LASERS

PRIORITY

The present application claims priority to U.S. provisional patent application Ser. No. 62/641,163, filed on Mar. 9, 2018, which is incorporated by reference in its entirety.

BACKGROUND

When it comes to fiber-to-the home (FTTH) or the other fiber network architectures (FTTx), optical test and quality engineers are on the front line of the battle between cost and reliability. On one hand, there are expectations to select the lowest cost optical components (splitters, cables, connectors, and enclosures or frames that hold connection points), but there are also expectations that the components will last for 25 years or more. Accordingly, audit programs are often employed to continually require environmental stress testing of optical components. Insertion Loss (IL) and Return Loss (RL) are critical performance parameters for many optical components. Accelerated aging and real-time test monitoring has become the standard approach to demonstrating equipment lifespan.

Measuring and testing of the optical components for critical performance parameters, including IL, RL, Polarization Dependent Loss (PDL), etc., may be performed by connecting a device under test (DUT), such as an optical component of a fiber optic transmission system, to an optical input source, such as a laser, to measure the performance parameters. However, lasers will often drift, due to either intrinsic or extrinsic reasons, and the drift should be compensated for during measurement procedures. Typically, power measurements are normalized and corrected by use of an input optical tap, which gives access to a portion of the input optical signal transmitted by the laser to the DUT. However, if there is no access to the input optical signal, such as through an optical tap, and the power of the laser fluctuates, then the measured losses of the DUT might incorrectly be attributed to the DUT.

BRIEF DESCRIPTION OF DRAWINGS

Features of the present disclosure are illustrated by way of examples shown in the following figures. In the following figures, like numerals indicate like elements, in which:

FIGS. 2A-B show example setups of the test instrument;

FIG. 5 shows an example method.

DETAILED DESCRIPTION

Figure 1:
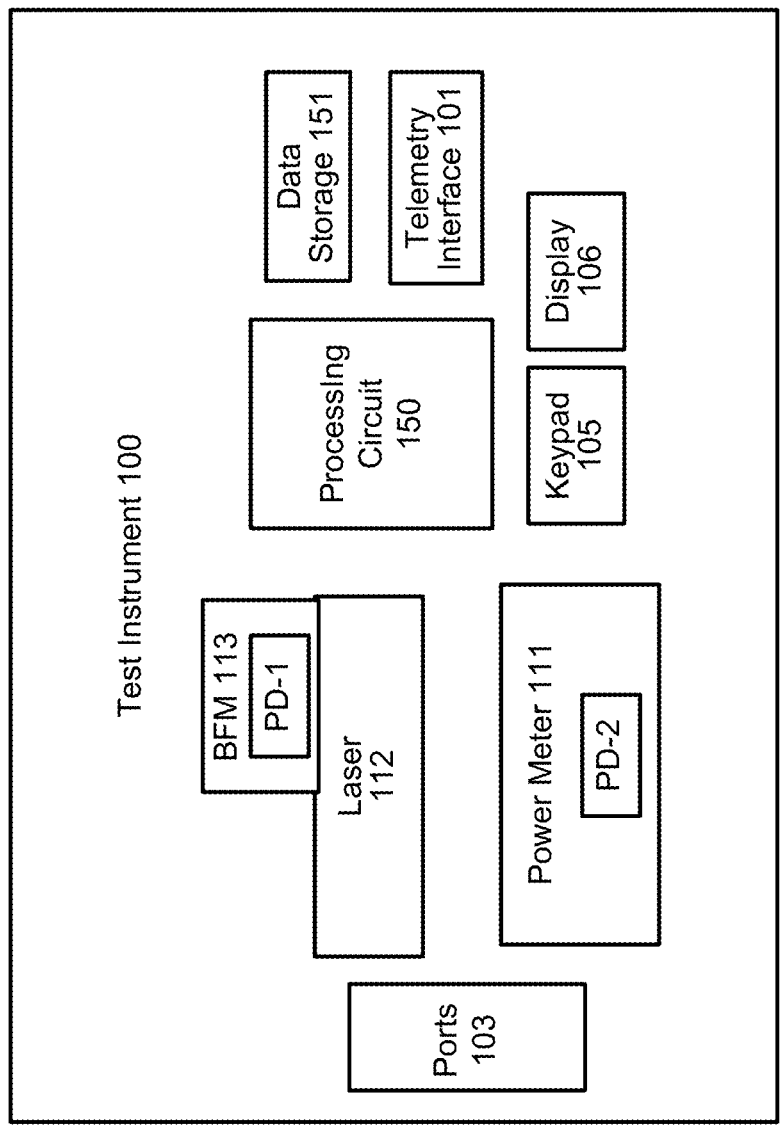
FIG. 1 shows a high-level block diagram of a test instrument, according to an example of the present disclosure.

For simplicity and illustrative purposes, the present disclosure is described by referring mainly to examples thereof. In the following description, numerous specific details are set forth in order to provide a thorough understanding of the present disclosure. It will be readily apparent, however, that the present disclosure may be practiced without limitation to these specific details. In other instances, some methods and structures have not been described in detail so as not to unnecessarily obscure the present disclosure. Throughout the present disclosure, the terms "a" and "an" are intended to denote at least one of a particular element. As used herein, the term "includes" means includes but not limited to, and the term "including" means including but not limited to. The term "based on" means based at least in part on.

Referencing is a general set of processes and algorithms by which the system samples and monitors the stability of potential sources of drift during a measurement cycle. Several monitoring points are available, including splice-through paths for monitoring IL drift, switch termination positions, and reflection artifacts to measure parasitic RL levels. These are used in the measurement algorithms that determine the IL and RL values of the DUT and subtract out system drift elements.

According to an embodiment of the present disclosure, drift of the optical source used in testing, such as a laser, is measured from a BFM (back-facet monitor). The BFM may be integrated into a laser, and may be used to measure power for the laser. For example, many modern lasers, such as DFB (Distributed Feedback), FP (Fabry Perot), TELG, SLED (super luminescent diode), LED type sources, etc., may already have a BFM built into the solid-state laser chip. The BFM may include a back-facet monitor photodiode that detects the intensity of the light exiting the rear facet of the laser cavity. The back-facet monitor samples a portion of the average optical power and provides a feedback current, which may be used in a control loop. Such a control loop adjusts the laser bias current to maintain a constant back-facet monitor photodiode current and hence a constant laser optical power. Accordingly, the BFM is typically used in a solid-state laser chip to maintain constant laser optical power output from the laser despite varying conditions, such as a temperature fluctuations, that can cause the optical power of the laser to drift. According to an embodiment of the present disclosure, a power reading can be taken from the BFM to be used for referencing when testing DUTs with the laser, as is further discussed below. Further, use of the BFM signal obviates the absolute need for performing power-calibrations for closed-loop operation. In other words, use of the BFM signal permits open-loop operation of the laser, with the advantage of minimizing calibration of lasers, and simplifying drive electronics and control requirements.

A DUT, such as an optical component, may be connected to the laser having the BFM to measure performance parameters of the DUT, such as IL, RL, PDL, etc. The DUT may be a passive optical component, such as splitters, cables, connectors, and enclosures or frames that hold connection points, etc. In an example, power measurements may be taken from the BFM to provide input power level referencing, and based on the input power level referencing, performance parameters, such as IL or other performance parameters, are calculated for the DUT.

The BFM signal may be used as a power-meter error-signal, and this information is used to create stable high precision, properly referenced IL measurements which account for input power level fluctuation of the laser. Also, the linearity and accuracy requirements of the BFM are relatively easy to attain, in terms of dynamic range, and accuracy. Typical output power fluctuations may only be a few decibels, and so the requirements are not so stringent.

In an example, the laser with BFM is operated in open-loop operation, and the BFM is not used to close the loop. Use of BFM in open loop allows loss or other parameters of the DUT to be measured without complex circuitry and calibration, which is typically incurred to attain a stable power from the laser. Open-loop signals and measurements will, in general, experience power levels that shift because of environmental conditions, such as temperature. In another example, the BFM is operated in closed-loop operation, and the control parameters of the laser are adjusted accordingly to hold, for instance, constant output power. Whether operated in open-loop or closed-loop operation, power measurements may be obtained from the BFM by accessing pins or other connectors connected to the BFM on the solid-state laser chip.

The BFM provides a rapid response to transient events. A laser may be operated in a pulsed mode, and the test instrument, in one example, may use an interrupt hardware line to simultaneously achieve fast BFM power-readings while driving the pulsed mode. In this example, the interrupt hardware line may be used to achieve the pulsing in order to use the synchronized BFM power-readings at higher throughputs throughout the transient event. In another example, the interrupt hardware line is not needed. Instead, continuous measurements of the BFM power-readings are taken, which are not triggered by an interrupt.

In an example, an equation for calculating IL is shown below.

$$IL = P_{reference} - P_{DUT} \qquad \text{Equation 1}$$

$P_{reference}$ is the power measurement taken without the DUT connected to the test instrument, while $P_{DUT}$ is the measurement taken with the DUT connected to the test instrument. $P_{DUT}$ is also referred to as the DUT power or input power. Drift effects are considered when measuring IL, according to an embodiment. The IL calculation in Equation 1 has drift effects hidden in it that are not necessarily evident at first glance. Such effects are difficult to manage and remove from the overall uncertainty of IL measurements without taking deliberate steps to mitigate or quantify. The first step in measuring IL is the reference measurement, $P_{reference}$. A user may measure one or many DUTs in succession using a test instrument, however, if the launch power from the source, also referred to as the source power, changes between each measurement, it immediately impacts the measurement by adding drift to the IL. According to an embodiment, $P_{reference}$ is determined based on the measurements taken from the BFM to account for drift of the source, such as laser drift, to determine more accurate IL measurements.

Other parameters may also be measured. For example, RL may be calculated as follows: $RL = P_{TX} - P_R$. $P_{TX}$ is the optical power output by the laser, such as the laser 112 mentioned below. $P_R$ is the reflected power. Referencing is a general set of processes and algorithms by which the system samples and monitors the stability of potential sources of drift during a measurement cycle. Referencing may be performed, prior to measuring performance parameters of the DUT, to calibrate $P_{TX}$ or other values to account for drift of the laser optical power, and/or to account for loss caused by the test instrument or a patch cord connecting the DUT.

There are several different ways to characterize polarization dependent loss (PDL) on a device. In an example, the Mueller-Stokes method may be used to calculate PDL. For example, four well-known polarization states are applied by the test instrument 100. The optical power transmission is measured at these four states over a predefined wavelength range and the PDL calculated from those results. This measurement also has an implicit time-sensitivity to the stability of the sources, and the test instrument can account for drifts to obtain the more accurate PDL measurements.

FIG. 1 shows a high-level block diagram of test instrument 100, according to an embodiment. The test instrument 100 may include components other than shown. The test instrument 100 may include one or more ports 103 for connecting the test instrument 100 to DUTs or other test points. The ports 103 may include connectors for connecting to optical cables. The test instrument 100 may include a telemetry interface 101 for connecting to a telemetry channel, such as a Wi-Fi interface, Bluetooth interface, cellular interface or another network interface. The test instrument 100 may connect to a remote device via the telemetry interface 101.

The test instrument 100 includes a user interface which may include a keypad 105 and/or a display 106. The display 106 may include a touch screen display. A user may interact with the test instrument 100, such as to enter information, select operations, view measurements, view interference profiles, etc., via the user interface.

A data storage 151 may store any information used by the test instrument 100 and may include memory or another type of known data storage device. The data storage 151 may store power level measurements and/or any other measurements or data or parameters determined by or used by the test instrument 100. The data storage 151 may include a non-transitory computer readable medium storing machine-readable instructions executable by processing circuit 150 to perform operations of the test instrument 100.

Laser 112 is an optical source for emitting optical signals, for example, on an optical cable connected to the test instrument 100 via one of the ports 103, such as port 103A shown in FIGS. 2A-B. A DUT may be connected to the optical cable to test the DUT. Referring to FIG. 1, the laser 112 includes BFM 113. The BFM 113 includes a BFM photodiode, shown as PD-1, that is used to measure optical power of the laser 112. The laser 112, including the BFM 113, may be provided on a chip (e.g., an integrated circuit) included in the test instrument 100. The BFM 113 for example samples a portion of the average optical power and provides a feedback current to a control loop to control drift. The BFM photodiode, PD-1, may be used in the control loop to try to maintain the laser optical power of the laser 112. The laser 112 and BFM 113 may be provided on a chip that is connected to processing circuit 150. The BFM 113 may include pins that provide a digital output that is representative of the power measured by PD-1. Processing circuit 150 may read the output to determine the optical power of the laser 112. A power meter 111 measures power of transmitted and/or received optical signals. For example, the power meter 111 includes a photodiode PD-2 that measures optical power at one or more of the ports 103. In an example, PD-2 may measure power at port 103B shown in FIGS. 2A-B.

Processing circuit 150 shown in FIG. 1 may include any suitable hardware to perform the operations of the test instrument 100 described herein. The operations include measuring and testing operations, including determining $P_{reference}$ and determining performance parameters (e.g., IL, RL, etc.) of a DUT that may be connected to the test instrument 100. The hardware of the test instrument 100, including the processing circuit 150, may include a hardware processor, microcontroller, a digital signal processor (DSP), an application specific integrated circuit (ASIC), a field programmable gate array (FPGA) or other programmable logic device, discrete gate or transistor logic, discrete hardware components, or any combination thereof designed to perform the functions and methods described herein. In an example, one or more of the functions and operations of the test instrument 100 described herein may be performed by the processing circuit 150 or other hardware executing machine readable instructions stored in a non-transitory computer readable medium, which may comprise RAM (random access memory), ROM (read only memory), EPROM (erasable, programmable ROM), EEPROM (electrically erasable, programmable ROM), hard drives, flash memory, or other types of storage devices, which may be volatile and/or nonvolatile.

FIGS. 2A-B show example of setups for the test instrument 100. In FIG. 2A, an optical cable 200 is connected between ports 103A-B. The laser 112 emits light from port 103A onto the optical cable 200, and the light is received at port 103B. In this setup, $P_{reference}$ may be determined by the test instrument 100. For example, a power measurement is taken from the BFM 113 to measure optical power of the laser 112 which is 1 dB emitting light onto the cable 200 via port 103A. Also, optical power is measured at port 103B for example using PD-2. In an example, $P_{reference}$ may be the difference. FIG. 2B shows another setup to measure $P_{DUT}$ whereby DUT 201, e.g., a passive optical component of a fiber optic network, is connected to the test instrument 100 via optical cables 200A-B. Power measurements may be measured by PD-1 of the BFM 113 and PD-2 of the power meter 111 to determine $P_{DUT}$. The processing circuit 150 may calculate IL of the DUT 201 based on $P_{reference}$ and $P_{DUT}$. Other types of DUTs may similarly be connected to the test instrument 100 to determine IL or other performance parameters after input power level referencing is performed. Generally, the test instrument 100 creates relative-quantities at the referencing and measurement times that account for dynamically changing measurement conditions. Such a technique is not limited to IL alone, and examples are discussed below with respect to IL for its inherent clarity and simplicity.

Figure 3A:
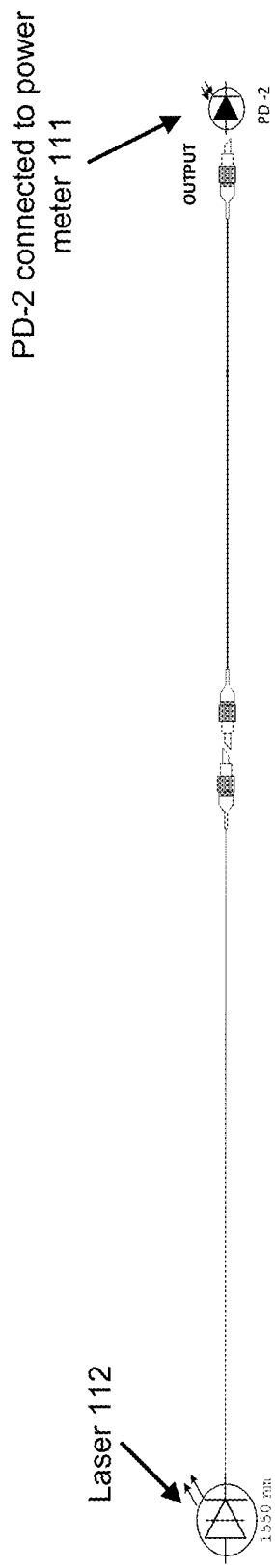
FIGS. 3A-B show schematics of examples of test instrument setups.
Figure 3B:
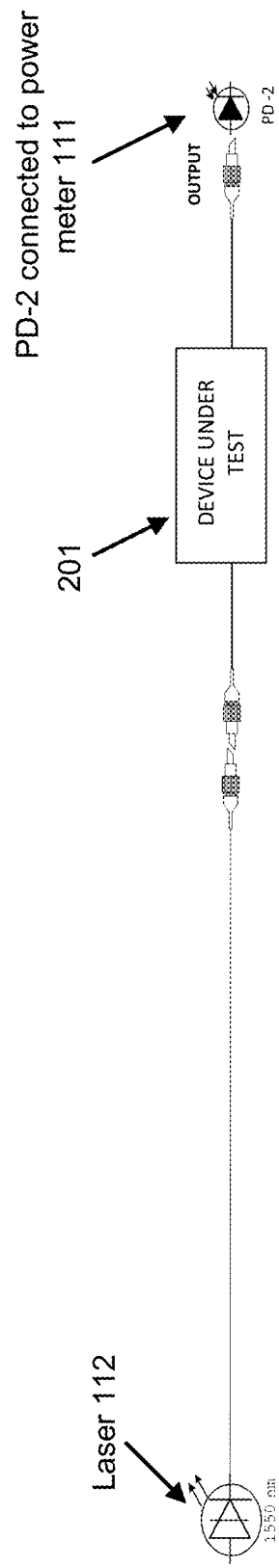

Examples are now described to explain the benefits of using power obtained from the BFM 113 as a power-meter error-signal to determine properly referenced IL measurements or other measurements that account for input power level fluctuations of the laser 112. FIGS. 3A-B show schematic illustrations of setups of the test instrument 100 for measuring IL without using the BFM 113. Instead, in FIG. 3A, reference power, $P_{reference}$, is measured using photodiode PD-2 at port 103B without the DUT 201 connected to the test instrument 100, and, as shown in FIG. 3B, $P_{DUT}$ is measured using photodiode PD-2 at port 103A when the DUT 201 is connected to the test instrument 100. In this example, IL may be determined by step (1) measuring $P_{reference}$ at a time t1 at PD-2 without the DUT 201 connected to the test instrument 100 (such as shown in FIG. 3A); step (2) measuring $P_{DUT}$ at a subsequent time t2 at PD-2 with the DUT 201 connected to the test instrument 100 (such as shown in FIG. 3B); and step (3) calculating IL. For example, IL=$PD2_{t1}$−$PD2_{t2}$, where $PD2_{t1}$ is $P_{reference}$ measured as shown in FIG. 3A at time t1, and $PD2_{t2}$ is $P_{DUT}$ measured as shown in FIG. 3B at time t2. Now further assume that $PD2_{t1}$ is −10 dBm (decibel-milliwatts) as measured in step (1), and assume $PD2_{t2}$ is −11 dBm as measured at step (2) because the real IL of the DUT is 1 dBm. Then, at step 3, IL=$PD2_{t1}$−$PD2_{t2}$=−10−(−11)=1 dBm.

Continue with the example discussed above, but assume that the source power, i.e., the output power of the laser 112, drops 5 dBm between times t1 and t2. Now $PD2_{t2}$ as determined at step (2) is −16 dBm (i.e., −11 dBm−5 dBm=−16 dBm). Then, at step (3), IL=$PD2_{t1}$−$PD2_{t2}$=−10 dBm−(−16 dbM)=6 dBm. This produces an error of 5 dBm for IL because the 5 dBm drop of the source power of the laser 112 between times t1 and t2 is not accounted for.

Figure 4A:
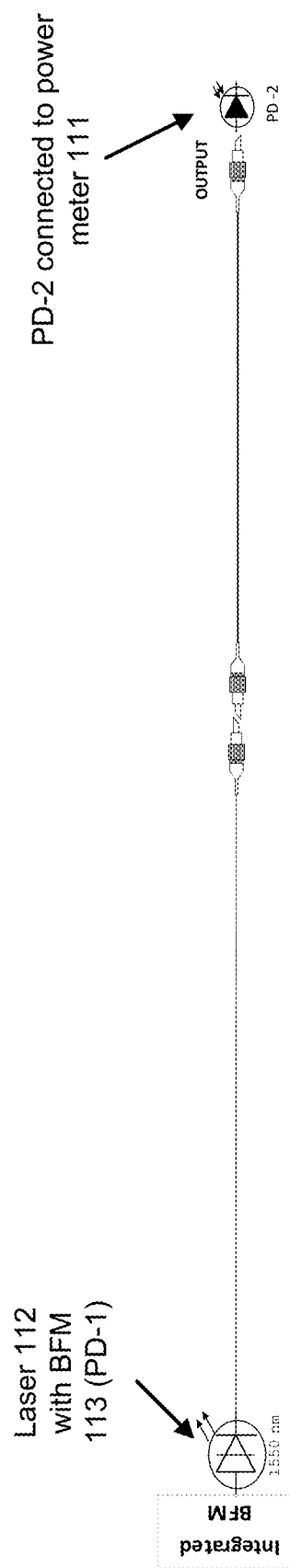
FIGS. 4A-B show schematics of further examples of test instrument setups.
Figure 4B:
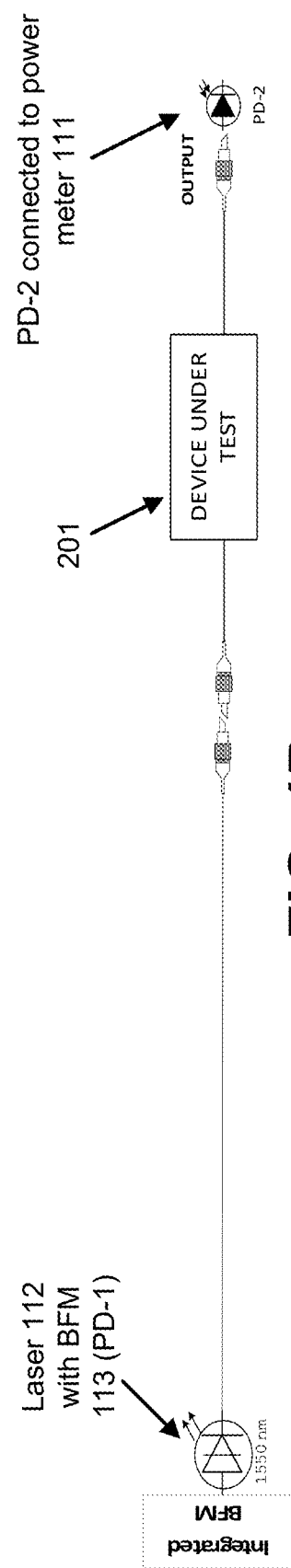

The benefit of using the BFM 113 to determine power-meter error-signals to determine properly referenced measurements, without the usual need for external coupling optics, is now described with respect to FIGS. 4A-B and assuming the 5 dBm drop of the source power of the laser 112 between times t1 and t2, as described in the example above. FIGS. 4A-B show schematic illustrations of setups of the test instrument 100 for measuring IL using the BFM 113 to measure power at the laser 112. In FIGS. 4A-B, a photodiode in the BFM 113 is used to measure the power at the laser 112, and is shown as PD1. Equations are shown below for calculating IL using the BFM 113.

As discussed above, Equation 1 is for calculating IL and is shown below. Equation 2, also shown below, considers power-meter error-signals that can account for drift when calculating IL.

$$IL = P_{reference} - P_{DUT} \quad \text{Equation 1}$$

$$IL = (PD2_{t1} - PD1_{t1}) - (PD2_{t2} - PD1_{t2}) \quad \text{Equation 2}$$

In Equation 2, $P_{reference}$=$PD2_{t1}$−$PD1_{t1}$ and $P_{DUT}$=$PD2_{t2}$−$PD1_{t2}$. $P_{reference}$ and $P_{DUT}$ are calculated as a function of PD1, which is the power measured at the BFM 113 by PD1. FIG. 4A shows measuring $P_{reference}$ at time t1. For example, assume at time t1, $PD2_{t1}$ is −10 dBm and $PD1_{t1}$ is −10 dBm. Thus, $P_{reference}$=$PD2_{t1}$−$PD1_{t1}$=−10 dBm−(−10 dBm)=0. FIG. 4B shows measuring $P_{DUT}$ at time t2, i.e., the DUT is connected to the test instrument 100. Assume the source power, i.e., the output power of the laser 112, drops 5 dBm between times t1 and t2 and assume the real IL of the DUT connected to the test instrument 100 is 1 dBm. Then, the measured $PD2_{t2}$=−16 dBm, and the measured $PD1_{t2}$=−16 dBm. Thus, $P_{DUT}$=$PD2_{t2}$−$PD1_{t2}$=−16 dBm−(−15 dBm)=−1 dBm. Therefore, IL=$P_{reference}$−$P_{DUT}$=0 dbm−(−1 dbm)=1 dBm. As can be seen by this calculation, even though there was a 5 dBm drop in the source power between times t1 and t2, there is no 5 dBm error in the IL determined from the measured $P_{reference}$ and $P_{DUT}$ as shown by the calculation in Equation 2. Similarly, the BFM 113 may be used to measure performance parameters of the DUT, such as RL, PDL, etc.

FIG. 5 shows a method 500 that may be performed by the test instrument 100 to determine a performance parameter of the DUT 201. At 501, the test instrument 100 measures optical power at BFM 113 of laser 112 emitting light from at least one port of the test instrument 100, such as port 103A shown in FIGS. 4A-B, and at 502, the test instrument 100 measures optical power of input light received via at least one port of the test instrument, such as port 103B shown in FIGS. 4A-B. For example, a first set of measurements are performed at PD-1 and PD-2 to determine $P_{reference}$ and a second set of measurements are performed at PD-1 and PD-2 to determine $P_{DUT}$, which is described above with respect to Equation 2. At 503, the test instrument 100 calculates $P_{reference}$ and $P_{DUT}$ based on the measurements performed at 502, which may include the first and second set of measurements. $P_{reference}$ and $P_{DUT}$ are calculated as a function of PD1 to account for drift of the optical power of the laser 112. At 504, the test instrument 100 determines a performance parameter, such as IL or another performance parameter, of the DUT 201 based on $P_{reference}$ and $P_{DUT}$.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

What is claimed is:

1. A test instrument to test optical components, the test instrument comprising:
    a laser;
    a back-facet monitor including a back-facet monitor photodiode to measure optical power at the laser;
    a power meter including a photodiode to measure optical power at a port connectable to a device under test (DUT) that is being tested by the test instrument; and
    a processing circuit to:
        determine a first set of measurements performed by the back-facet monitor photodiode and the photodiode of the power meter;
        determine a reference power based on the measurements performed by the back-facet monitor photodiode and the photodiode of the power meter, wherein the reference power is determined as a difference between a power measurement, of the first set of the measurements, taken by the back-facet monitor photodiode and another power measurement, of the first set of the measurements, taken by the photodiode of the power meter;
        determine a DUT power based on a second set of the measurements performed by the back-facet monitor photodiode and the photodiode of the power meter when the DUT is connected to the test instrument; and
        determine a performance parameter of the DUT based on the reference power and the DUT power, wherein the performance parameter comprises at least one of insertion loss, return loss and polarization dependent loss.

2. The test instrument of claim 1, wherein the reference power is determined based on the first set of the measurements measured when the DUT is not connected to the test instrument.

3. The test instrument of claim 2, wherein the DUT power is determined based on the second set of the measurements measured when the DUT is connected to the test instrument.

4. The test instrument of claim 3, wherein the first set of measurements are performed at a time t1 and the second set of measurements are performed at a time t2 that is subsequent to the time t1.

5. The test instrument of claim 4, Wherein the processing circuit determines the performance parameter of the DUT based on the optical power of the laser measured at t1 and an optical power measured by the photodiode of the power meter at t2.

6. The test instrument of claim 1, wherein the processing circuit accounts for drift in optical power of the laser occurring during the measurements to determine the performance parameter.

7. The test instrument of claim 1, wherein the DUT comprises a passive optical component.

8. The test instrument of claim 7, wherein the photodiode of the power meter is operable to measure input optical power of light received at the port that was emitted by the laser.

9. A test instrument to test a device under test (DUT) comprising an optical component, the test instrument comprising:
    a laser;
    a back-facet monitor including a back-facet monitor photodiode to measure optical power at the laser;
    a first port and a second port connectable to at least one of an optical cable and the DUT, wherein the laser is operable to emit light into the optical cable when connected to the first port;
    a power meter including a photodiode to measure input optical power of light received at the second port; and
    a processing circuit to:
        determine measurements performed by the back-facet monitor photodiode and the photodiode of the power meter;
        determine a reference power based on a first set of the measurements performed by the back-facet monitor photodiode and the photodiode of the power meter when the DUT is not connected to the test instrument, wherein the reference power is determined as a difference between a power measurement, of the first set of the measurements, taken by the back-facet monitor photodiode and another power measurement, of the first set of the measurements, taken by the photodiode of the power meter;
        determine a DUT power based on a second set of the measurements performed by the back-facet monitor photodiode and the photodiode of the power meter when the DUT is connected to the test instrument; and
        determine a performance parameter of the DUT based on the reference power and the DUT power that accounts for drift of the optical power of the laser when the first and second sets of the measurements are measured.

10. The test instrument of claim 9, wherein the first set of the measurements are performed at a time t1 and the second set of the measurements are performed at a time t2 that is subsequent to the time t1.

11. The test instrument of claim 9, wherein the performance parameter comprises at least one of insertion loss, return loss and polarization dependent loss.

12. The test instrument of claim 9, wherein the DUT comprises a passive optical component.

13. The test instrument of claim 9, wherein the first set of the measurements to determine the reference power are measured at a time t1 when an optical cable is connected between the first and second ports and the laser emits light into the optical cable, and the second set of the measurements to determine the DUT power are measured at a time t2 that is subsequent to the time t1 when the DUT is connected to the first and second ports via optical cables,
    wherein the DUT comprises a passive optical component, and
    wherein the performance parameter comprises at least one of insertion loss, return loss and polarization dependent loss.

14. A method executable by a test instrument to test an optical component of a fiber optic network, the method comprising:
    measuring optical power at a back-facet monitor of a laser operable to emit light via at least one port of the test instrument;
    measuring optical power of input light received at the at least one port by a photodiode of a power meter of the test instrument;
    determining a reference power from a difference of the measured optical power at the back-facet monitor and the measured optical power of the input light received at the at least one port and measured by the photodiode of the power meter;

measuring a second set of the measurements performed by the back-facet monitor and the photodiode of the power meter when a device under test (DUT) is connected to the test instrument and determining a performance parameter of the optical component being tested based on the reference power and the second set of measurements.

15. The method of claim 14, wherein the reference power is determined based on a first set of the measurements when the DUT is not connected to the test instrument.

16. The method of claim 14, wherein the first set of the measurements are performed at a time t1 and the second set of the measurements are performed at a time t2 that is subsequent to the time t1.

17. The method of claim 14, wherein the performance parameter comprises at least one of insertion loss, return loss and polarization dependent loss.

* * * * *